US010241377B1

(12) United States Patent  
Wang et al.

(10) Patent No.: US 10,241,377 B1  
(45) Date of Patent: Mar. 26, 2019

(54) SELF-HEALING FLEXIBLE ELECTROPHORETIC DISPLAYS

(71) Applicant: Amazon Technologies, Inc., Seattle, WA (US)

(72) Inventors: Ming Wang, Fremont, CA (US); Weihsin Hou, Fremont, CA (US); Anoop Menon, Capitola, CA (US); Robert Arthur Sprague, Saratoga, CA (US); Eric Gifford Marason, San Francisco, CA (US); Yuyan Hua, Santa Clara, CA (US); Shan Cheng, Los Altos, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/707,307

(22) Filed: Sep. 18, 2017

(51) Int. Cl.
| G09G 3/36 | (2006.01) |
| G02F 1/167 | (2019.01) |
| G06F 3/041 | (2006.01) |
| G06F 1/16 | (2006.01) |
| H01L 27/12 | (2006.01) |

(52) U.S. Cl.
CPC .......... G02F 1/167 (2013.01); G06F 1/1652 (2013.01); G06F 3/041 (2013.01); H01L 27/1218 (2013.01)

(58) Field of Classification Search
CPC ...... G06F 3/041; G06F 3/0412; G06F 3/0416; G06F 3/0418; G06F 3/044
See application file for complete search history.

(56) References Cited

U.S. PATENT DOCUMENTS

| 8,552,989 | B2 * | 10/2013 | Hotelling ............ G02F 1/13338 345/104 |
| 9,046,976 | B2 * | 6/2015 | Liu ........................ G06F 3/0412 |
| 9,122,362 | B2 * | 9/2015 | Park ........................ G06F 3/044 |
| 10,120,515 | B1 * | 11/2018 | Ghali ........................ G06F 3/044 |
| 2014/0176848 | A1 | 6/2014 | Gupta et al. |
| 2016/0170250 | A1 | 6/2016 | Ghali et al. |
| 2017/0147036 | A1 | 5/2017 | Mathew et al. |
| 2017/0176835 | A1 | 6/2017 | Gupta et al. |

OTHER PUBLICATIONS

International Search Report and Written Opinion for International Application No. PCT/US2018/050429, dated Nov. 27, 2018, 14 pages.

* cited by examiner

*Primary Examiner* — Vijay Shankar
(74) *Attorney, Agent, or Firm* — Eversheds Sutherland (US) LLP

(57) ABSTRACT

Systems, methods, and computer-readable media are disclosed for self-healing flexible electrophoretic displays and related devices. In one embodiment, an example flexible electrophoretic display may include a flexible plastic thin film transistor (TFT) backplane having a first width, an electrophoretic layer coupled to the flexible plastic TFT backplane, an electrode layer coupled to the electrophoretic layer, an integrated circuit disposed on the flexible plastic TFT backplane, and a protective sheet having a second width that is greater than or equal to the first width.

20 Claims, 8 Drawing Sheets

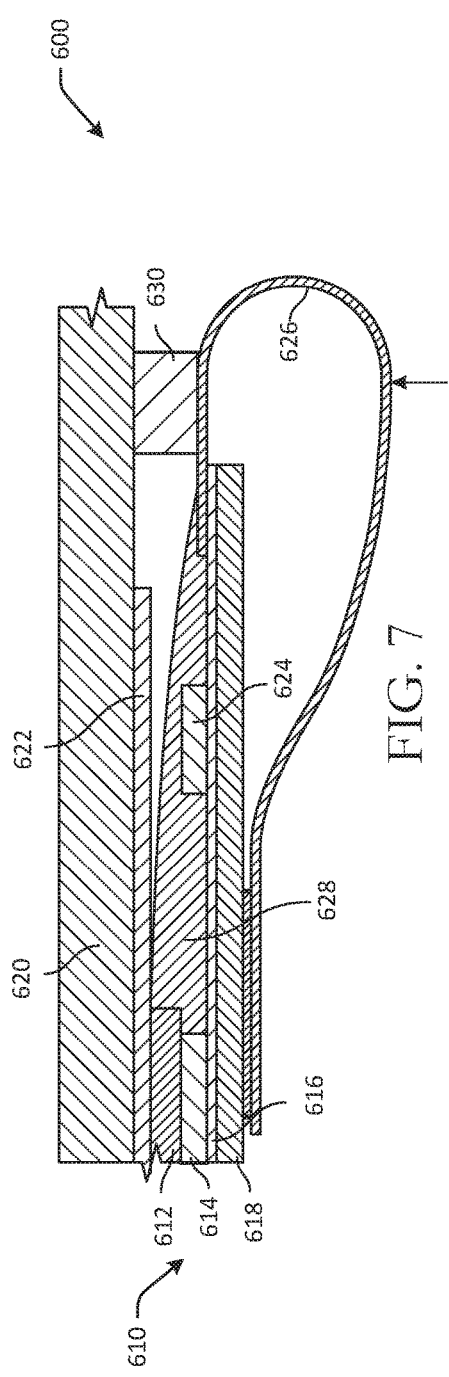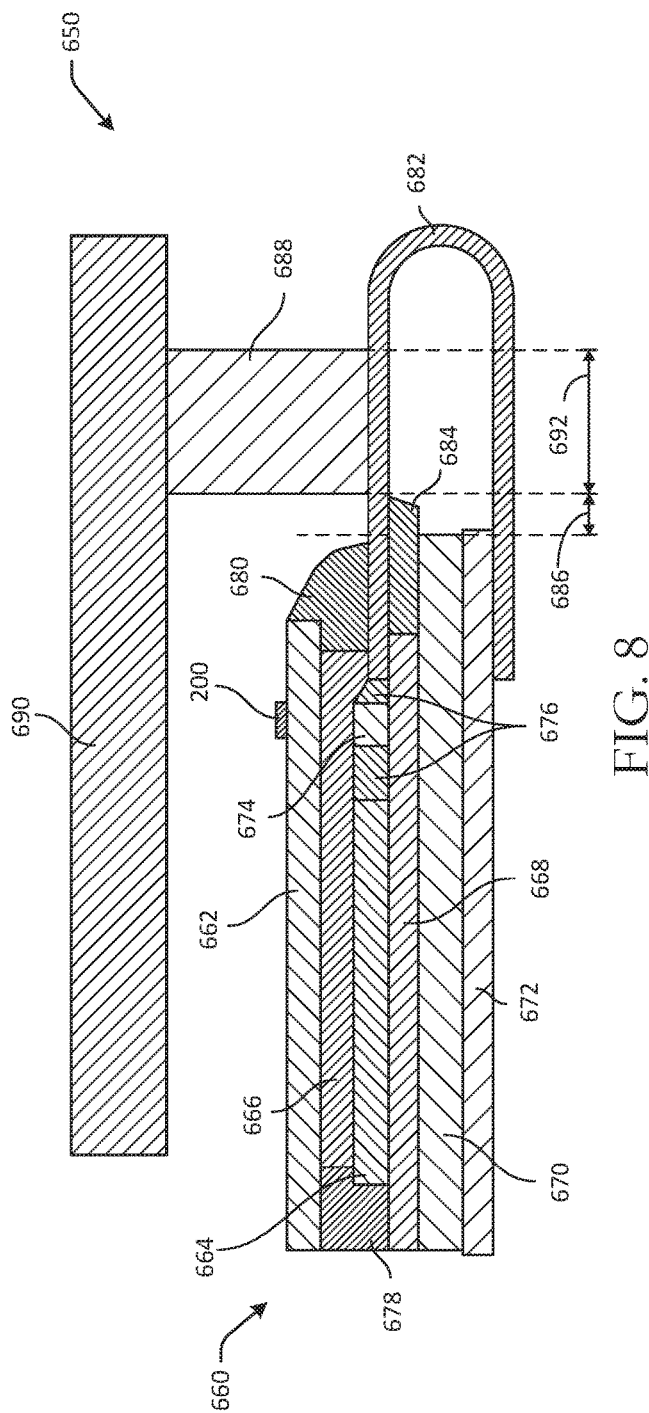

SELF-HEALING FLEXIBLE ELECTROPHORETIC DISPLAYS

BACKGROUND

Electronic devices may include displays to present information to users. Display thickness may affect overall thickness of electronic devices, and thinner displays may therefore be used to form thinner electronic devices. In addition, electronic devices may be subject to damage caused by drops or other unintentional handling of electronic devices. Such damage may include damage to displays, such as cracking, shattering, and the like. Displays may also affect other aspects of electronic devices. For example, lighting components may output light that is visible through various portions of a device housing, which may be undesirable and negatively impact viewability of the display.

BRIEF DESCRIPTION OF THE DRAWINGS

FIGS. 7-8 are schematic illustrations of cross-sectional side views of an electronic device with a self-healing flexible electrophoretic display in accordance with one or more embodiments of the disclosure.

Figure 1:
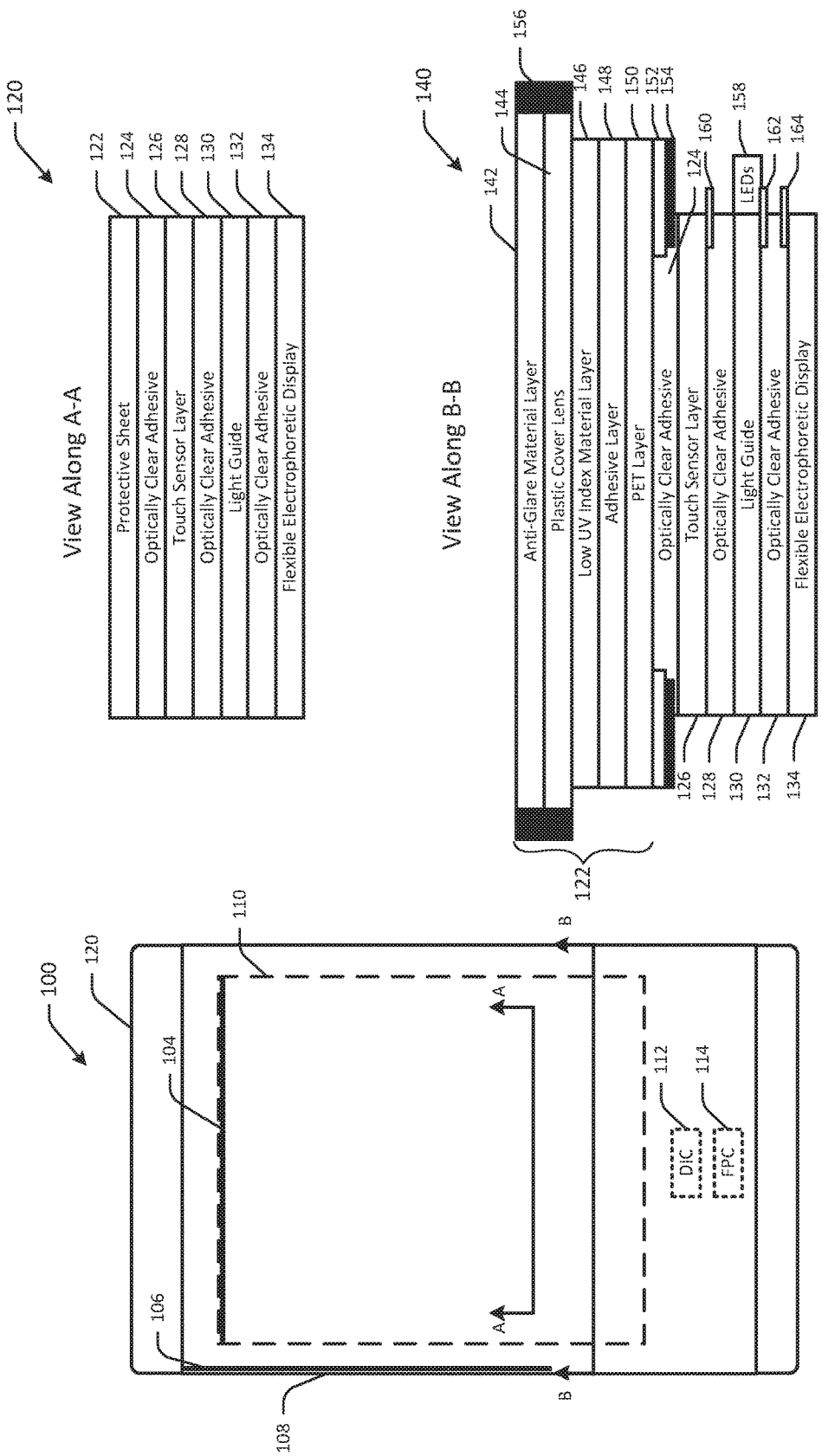
FIG. 1 is a schematic illustration of a top view and cross-sectional views of an electronic device with a display stack in accordance with one or more embodiments of the disclosure.

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

Multimedia devices may be used to output digital content, and in some instances, to cause content to be presented at one or more display devices for consumption by users. For example, multimedia devices may be content streaming devices that stream digital content, and may be configured to read one or more data storage devices to cause presentation of content stored on the data storage device. Multimedia devices may include a variety of devices, such as electronic reader ("e-reader") devices, desktop computers, portable computers, smartphones, tablet computers, televisions, wearable devices, speaker devices, and so forth that may be used to access various forms of content and other information. Such devices may include displays that are used to present information or content to users.

Certain electronic devices may be subject to potential damage, such as tablets or smartphones that are susceptible to falls or drops. Resulting damage from incidents like falls or drops can include damage to displays, such as cracked or shattered screens. Embodiments of the disclosure include self-healing displays that are resistant to damage, and may be resistant to cracks and/or shatterproof. Certain embodiments include flexible display stacks that have increased flexibility, thereby increasing durability of the electronic device and/or display. In addition, some embodiments may include relatively thinner displays as a result of using plastic materials instead of glass, which may facilitate thinner device profiles. Thinner device profiles may increase portability and/or functionality of devices by creating additional room for other components. Furthermore, certain devices may have light leakage issues about a display of the device, where light may cause issues such as a glow around an active display, leakage of visible light at edges of a device, and/or a halo effect about a perimeter of a display surface of the device. Light leakage issues may be exacerbated by a color of a device housing. For example, devices with white colored, or relatively lighter colored, housings may be more susceptible to light leakage issues than, for example, devices with darker or black colored housings.

Embodiments of the disclosure include self-healing flexible electrophoretic displays. Display stacks of the disclosure may be thinner than other displays, and may be more durable and/or resistant to damage than other displays. Electronic devices that include display stacks of the disclosure may have thinner profiles, increased functionality as a result of increased internal space, and may avoid light leakage issues that may negatively impact viewability or readability of a display. In some example embodiments, the display stacks described herein may be flat and/or planar display stacks, while in other example embodiments, one or more components of the display stacks may be curved or partially curved. Certain embodiments of the disclosure may be aesthetically pleasing to users by removing light leakage and/or halo effects caused by lighting issues of electronic devices and/or displays.

The techniques, methods, and processes described herein may be used to manufacture plastic-based display stack components that can replace glass-based components. As a result, device and display durability may be improved, and securing or mounting mechanisms for mounting display stacks in device housings may be simplified. In addition, components used to secure glass-based display components may no longer be needed. While described in the context of electrophoretic displays and display stacks, aspects of this disclosure are more broadly applicable to other forms of display stacks and/or displays.

This disclosure relates to, among other things, systems, methods, computer-readable media, techniques, and methodologies for self-healing flexible electrophoretic displays. Display stacks, as described herein, may be used to form shatter resistant or shatterproof electronic displays that are relatively thin compared to other displays, and avoid light leakage issues regarding of device housing colors.

Referring to FIG. 1, an example electronic device 100 with a display stack 110 is depicted in accordance with one or more embodiments of the disclosure. The display stack 110 may be a self-healing display stack for use with an electronic reader device or other display device. The electronic device 100 may include a housing 102 within which a portion of or the entire display stack 110 may be positioned. In some embodiments, the display stack 110 may form some or all of the device housing, such as a portion of the outer display layer. The device 100 may be an e-reader device, a computer display, a portable computer, a smartphone, a tablet computer, a game console, a television, an in-vehicle display, and so forth. The display stack 110 may form a display of the electronic device 100 and may be configured to present information to and/or receive inputs from a user of the electronic device 100. In one example, the display stack 110 may form a touchscreen of the electronic device 100, where a user may touch or press a portion of the display stack 110 to make a selection or another input. The device 100 may include one or more circuits, such as a driver integrated circuit 112, a flexible printed circuit 114, and other circuitry.

A portion 120 of the display stack 110 is illustrated in cross-sectional view along line A-A. In the illustrated embodiment, the display stack 110 may include a number of layers. The layers may have different thicknesses and may not be illustrated to scale, and may not be illustrated to scale with respect to other layers or other figures.

In FIG. 1, the portion 120 of the display stack 110 may include a protective sheet 122. The display stack 110 may include a self-healing protective sheet 122 or plastic cover lens 144 having a first surface and a second surface, with an anti-glare material layer 142 disposed on the first surface. In some embodiments, the anti-glare material and the self-healing material layer may form a single layer. The self-healing protective sheet 122 may be formed of a self-healing material. Self-healing materials may be synthetic polymers, which have a capability to spontaneously repair damage by themselves without external human intervention. In some instances, cover lens surfaces can be scratched or cracked over time, which may affect display visibility and negatively impact a user experience. Self-healing materials can repair themselves through physical or chemical repairing mechanisms that respond to damage. Self-healing materials can include films or coatings that can be used as cover lens materials. Self-healing films can be free-standing films, or a layer of coating on a supportive substrate, such as a plastic substrate (e.g., PC, PMMA, PET, etc.). Example self-healing polymers include types of polyurethane or silicone, among others. After incurring damage, the polymer chains can reflow under room temperature and recover the original form factor. Such self-healing materials may have low glass transition temperatures, such as less than 50° C. or 40° C. Certain self-healing films or coatings can be optically clear or may have anti-glare surface features.

The protective sheet 122 may be a front protective sheet. The protective sheet 122 may form an outer surface of the display stack 110, and in some instances, may form an outer surface of the device 100. The protective sheet 122 may protect the display stack 110 from scratches, scuffs, and other damage. In some embodiments, the protective sheet 122 may be a multi-layered structure or composite, and may include one or more self-healing material layers or coatings. For example, the protective sheet 122 may include a self-healing anti-glare and/or anti-reflective coating disposed on a rigid substrate, such as a plastic substrate. The self-healing anti-glare and/or anti-reflective coating may form an outer layer of the display stack 110. Self-healing materials may include various polymers or plastics with self-healing properties, such as polyvinylidene fluoride cohexafluoropropylene, ionic salts, and the like.

A first optically clear adhesive layer 124 may be positioned at least partially between the protective sheet 122 and a touch sensor layer 126, and may couple the touch sensor layer 126 to the protective sheet 122. The first optically clear adhesive layer 124 may be formed of an optically clear adhesive, and may be in liquid or solid form. In some embodiments, the optically clear adhesive may be an adhesive tape. In some embodiments, the optically clear adhesive may be an acrylic adhesive.

The touch sensor layer 126 may include one or more capacitive or other touch sensors and may be formed, at least partially, of indium tin oxide and/or a uniform transparent electrode.

A second optically clear adhesive layer 128 may be positioned between the touch sensor layer 126 and a light guide 130, and may couple the light guide 130 to the touch sensor layer 126. The light guide 130 may be configured to direct light from one or more light emitting diodes (LEDs) or other light sources across some or all of the display stack 110. The light guide 130 may be formed of plastic or another material. For example, the light guide 130 may be used to illuminate the display stack 110 in a dark environment, and may provide light that does not directly impinge on a viewer's eyes, so as to reduce eye strain.

A third optically clear adhesive layer 132 may be positioned between the light guide 130 and a flexible electrophoretic display 134, and may couple the flexible electrophoretic display 134 to the light guide 130. Each of the optically clear adhesive layers may be formed of the same or different materials or adhesives. The flexible electrophoretic display 134 may be an electronic ink ("e-ink") layer may include a number of different layers, as illustrated in example embodiments in subsequent figures. Some embodiments may include an electrode layer, a touch layer, a microcapsule layer, a thin film transistor (TFT) layer, a backplane substrate or back protective sheet layer, and/or other or different components or layers. One or more color adjustable light emitting diodes (LEDs) 158 may be positioned adjacent to one or more surfaces of the light guide 130.

One or more flexible printed circuits (FPCs) may be coupled to various components of the display stack. For example, a touch layer FPC 160 may be coupled to a lower side or surface of the touch sensor layer 126. The touch layer FPC 160 may be positioned between the touch sensor layer 126 and the second optically clear adhesive layer 128. An LED FPC 162 may be coupled to one or more of the LEDs 158 and may be coupled to a lower surface of the light guide 130 with an adhesive, for example. The LED FPC 162 may be positioned between the light guide 130 and the EPD 134. An EPD FPC 164 may be coupled to the EPD 134 and may be positioned adjacent the third optically clear adhesive layer 132. The EPD FPC 164 and the LED FPC 162 may both be positioned between the light guide 130 and the EPD 134, with the LED FPC 162 adjacent the light guide 130 and the EPD FPC 164 adjacent the EPD 134. Other configurations may be used.

The device housing 102 may be any suitable color, such as white, black, pink, etc., and may be formed from a number of different materials, such as plastic, aluminum, etc. The device housing color and/or material may affect light leakage issues caused by light leaking about portions of the display stack 110. For example, display area glow 104 may be a glow visible next to an active area of the display stack 110, edge light leakage 106 may be visible light that leaks through edges of a cover lens of the display stack 110 and may be visible after device assembly, and/or halo effects 108 which may be visible light that is reflected back into the cover lens, and may appear as a narrow glow around the edges of the cover lens of the display stack 110, etc. Embodiments of the disclosure may mitigate one or more light leakage issues regardless of the device housing color and/or material.

A portion 140 of the device 100 is illustrated in cross-sectional view along line B-B. In the illustrated embodiment, the device 100 and/or displays stack 110 may include a number of layers. The layers may have different thicknesses and may not be illustrated to scale, and may not be illustrated to scale with respect to other layers or other figures.

The bottom portion of the layers illustrated in portion 140 may be layers of the display stack 110 illustrated in the portion 120. "Bottom" and "top" as used herein are relative and not absolute positions. For example, the flexible electrophoretic display 134 may form a bottom of the illustrated portion 140, and may be stacked in the display stack with the third optically clear adhesive layer 132, the light guide 130, the second optically clear adhesive layer 128, the touch sensor layer 126, the first optically clear adhesive layer 124, and the protective sheet 122.

As illustrated in more detail in the portion 140, in some embodiments, the protective sheet 122 may include one or more components. For example, the protective sheet 122 may include an anti-glare material layer 142 configured to reduce glare on the display, a plastic cover lens 144 configured to support the anti-glare material layer 142 and protect the display stack 110, a low ultraviolet index material layer 146 configured to filter ultraviolet light, an adhesive layer 148, and a polyethylene terephthalate (PET) plastic layer 150 configured to support one or more components and/or protect the display stack 110. The first optically clear adhesive layer 124 may couple the protective sheet 122 to the touch sensor layer 126. In other embodiments, protective sheets may include additional, fewer, or different components. In some embodiments, certain components may not be considered to be part of the protective sheet and may be parts of other components or structures, such as the plastic cover lens. The anti-glare material layer 142 may include a self-healing material and may have other properties, such as ultraviolet light blocking, anti-reflective properties, and other properties.

In certain devices, such as devices with white colored housings, one or more dried ink layers may be coupled to the display stack 110 and/or another component, so as to mitigate light leakage issues. For example, in FIG. 1, a set of dried white ink layers 152 may be coupled to a surface of the PET layer 150. The dried white ink layers 152 may have a first width and may have multiple layers. For example, the dried white ink layers 152 may include three to five layers. The dried white ink layers 152 may be in a stacked configuration, and may be stacked vertically on top of each other, or may be slightly offset. A set of dried black ink layers 154 may be coupled to the dried white ink layers 152. The dried black ink layers 154 may be positioned opposite the PET layer 150. The dried black ink layers 154 may have a second width that is less than the first width, such that the dried black ink layers 154 are not visible from a top of the display stack 110. The number of dried black ink layers 154 may be less than the number of dried white ink layers 152. For example, there may be two dried black ink layers 154 and five dried white ink layers 152. The dried black ink layers 154 may be in a stacked configuration, and may be stacked vertically on top of each other, or may be slightly offset. The dried ink layers 152, 154 may be positioned along some or all edges or a perimeter of the device 100 and/or display stack 110. The dried ink layers 152, 154 may mitigate light leakage that causes halo effects and/or display area glow.

A black edge ink layer 156 may be formed about edges of the plastic cover lens 144, and may prevent light leakage that causes edge light leakage in certain colored devices. The black edge ink layer 156 may be formed of the same or different ink or material than the dried black ink layers 154.

As a result, by using plastic components instead of glass or other materials, and by allowing for self-healing functionality, devices may be thinner as a result of thinner display stacks. Light leakage issues may be resolved or mitigated by the display stacks and structure of the disclosure.

Example embodiments of the disclosure provide a number of technical features or technical effects. For example, in accordance with example embodiments of the disclosure, certain embodiments of the disclosure may mitigate light leakage issues, reduce display stack thickness, reduce device thickness, and improve durability. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of the embodiments disclosed herein are also within the scope of this disclosure. The above-described embodiments and additional and/or alternative embodiments of the disclosure will be described in detail hereinafter through reference to the accompanying drawings.

Illustrative Embodiments and Use Cases

Figure 2:
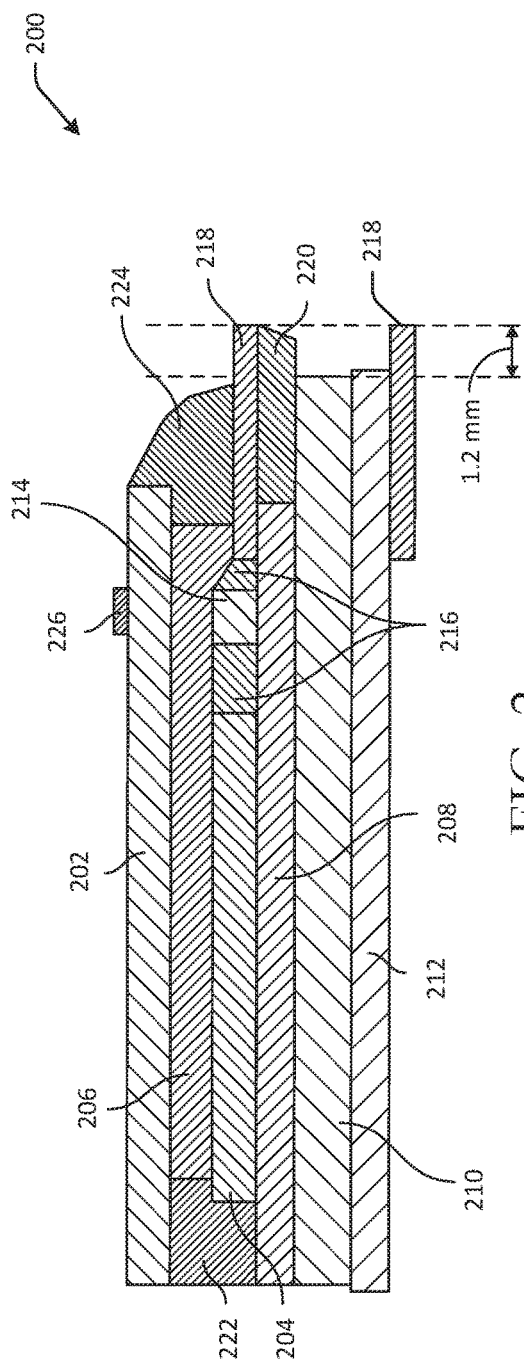
FIGS. 2-3 are schematic illustrations of cross-sectional views of flexible electrophoretic display stacks in accordance with one or more embodiments of the disclosure.

FIG. 2 is a schematic illustration of a cross-sectional view of a flexible electrophoretic display stack 200 in accordance with one or more embodiments of the disclosure. The flexible electrophoretic display stack 200 may be a thin protective sheet flexible electrophoretic display stack. The flexible electrophoretic display stack 200 may include a thin protective front sheet 202 adhered or otherwise coupled to a front plane laminate 204 with an optically clear adhesive. Specifically, an optically clear adhesive layer 206 may be disposed between the thin protective front sheet 202 and the front plane laminate 204. The thin protective front sheet 202 may have a thickness of about 100 microns, the optically clear adhesive layer 206 may have a thickness of about 175 microns, and the front plane laminate 204 may have a thickness of about 175 microns. In some embodiments, an epoxy edge seal may be disposed about a perimeter of the protective sheet 202 to increase water resistance and/or durability. Other embodiments may include different edge seal materials, such as acrylic materials, ultraviolet light curable materials, moisture barrier materials, and other suitable materials.

The flexible electrophoretic display stack 200 may include a polyimide film layer 208. The polyimide film layer 208 may include a polymer disposed on a substrate, and may include imide monomers. In some embodiments, the polyimide film layer 208 may have a thickness of about 40 microns. In some embodiments, the front protective sheet 202 may have a width that is greater than or equal to a width of the polyimide backplane or polyimide layer 208.

An optional back protective sheet 210 may support the polyimide film layer 208 and/or other components of the flexible electrophoretic display stack 200. The back protective sheet 210 may have a thickness of about 100 microns, and may optionally include an optically clear adhesive layer having a thickness of about 50 microns, for a total thickness of about 150 microns in one embodiment. The flexible electrophoretic display stack 200 may be mounted to or otherwise coupled to a mid-frame 212 of a device or housing. In some embodiments, the polyimide film layer 208 may be a flexible polyimide TFT layer. The polyimide TFT layer may be coupled to a microcapsule layer, and a back protective sheet may be coupled to an opposite side of the polyimide TFT layer, so as to support the polyimide TFT layer and/or the e-ink display layer.

An integrated circuit 214 may be coupled to the polyimide film layer 208. The integrated circuit 214 may be positioned adjacent to the front plane laminate 204. To protect the integrated circuit 214 and to stabilize and/or support the integrated circuit and the polyimide film layer 208, one or more portions of a sealant 216, such as a rigid sealant, may be positioned along one or more edges or edge surfaces of the integrated circuit 214. The sealant 216 may cure into a rigid material and may provide waterproofing or water resistant characteristics to protect the integrated circuit 214. In some embodiments, a first rigid sealant material may be disposed on the flexible polyimide TFT layer or polyimide film layer 208 along a first side of the integrated circuit 214, the first rigid sealant material configured to support the integrated circuit 214. A second rigid sealant material may be disposed on the flexible polyimide TFT layer or polyimide film layer 208 along a second side of the integrated circuit 214 opposite the first side.

A flexible printed circuit 218 may be at least partially coupled to the polyimide film layer 208 and/or the integrated circuit 214. The flexible printed circuit 218 may be supported by an ultraviolet light blocking and/or first stiffener material 220, so as to support positioning of the flexible printed circuit 218. The first stiffener material 220 may be positioned adjacent to the polyimide film layer 208 and may overhang an edge of the back protective sheet 210 by, in one example, about 1.2 mm.

A similar ultraviolet light blocking and/or second stiffener material 222, or a rigid sealant material, may be positioned on the polyimide film layer 208 on an opposite side of the front plane laminate 204. The second stiffener material 222 may have a thickness equal to or less than, or greater than, the thickness of the optically clear adhesive layer 206 and the front plane laminate 204 combined. The second stiffener material 222 may increase a water resistance of the flexible electrophoretic display stack 200.

A similar ultraviolet light blocking and/or third stiffener material 224, or a rigid sealant material, may be positioned on the flexible printed circuit 218 on an opposite side of the optically clear adhesive layer 206. The third stiffener material 224 may have a thickness equal to or less than, or greater than, the thickness of the optically clear adhesive layer 206 and the front protective sheet 202 combined. The third stiffener material 224 may increase a water resistance of the flexible electrophoretic display stack 200.

A light blocking material 226, such as a black tape segment or other light blocking material, may be positioned or disposed on the thin front protective sheet 202 and vertically aligned with, or aligned with, the integrated circuit 214. The light blocking material 226 may prevent light from impinging on the integrated circuit 214. In some embodiments, the integrated circuit may be disposed adjacent to the electrophoretic layer, and a light blocking material layer, such as a black tape or dark tape may be positioned between the integrated circuit and the (hot melt) protective sheet.

Figure 3:
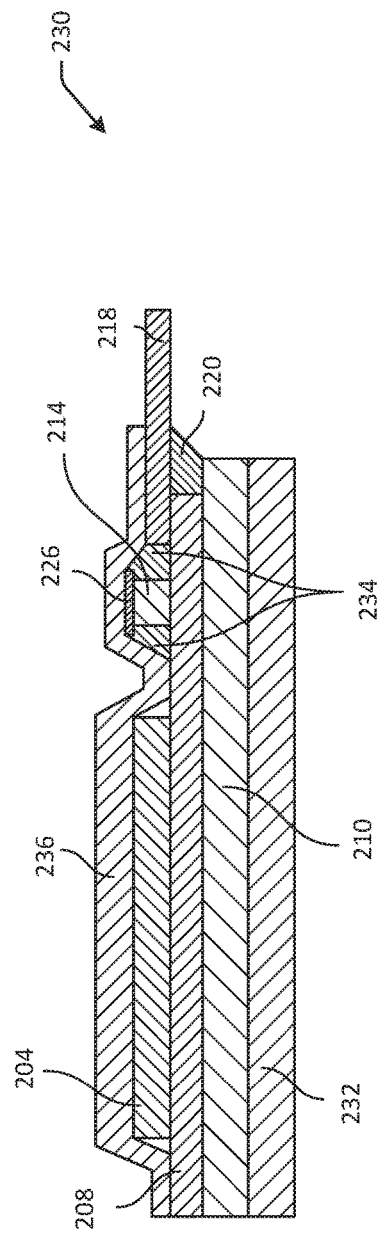

FIG. 3 depicts another embodiment of a flexible electrophoretic display stack 230 in accordance with one or more embodiments of the disclosure. The flexible electrophoretic display stack 230 may be different than the flexible electrophoretic display stack 200 and may include some of the same components. The flexible electrophoretic display stack 230 may be a hot melt protective sheet flexible electrophoretic display stack.

In the flexible electrophoretic display stack 230, the polyimide film layer 208 may be coupled to the optional back protective sheet 210 (which may include an optically clear adhesive layer). The back protective sheet 210 may be coupled to a mid-frame component 232 that may be thicker than the mid-frame 212 of the flexible electrophoretic display stack 200. The mid-frame 232 of the flexible electrophoretic display stack 230 may have a thickness of about 250 microns and may include an optional optically clear adhesive layer with a thickness of about 50 microns.

The first stiffener material 220 may support the flexible printed circuit 218, but may not overhang the back protective sheet by the same amount. The light blocking material 226 may be coupled to a surface of the integrated circuit 214, as opposed to being disposed on the front protective sheet in the flexible electrophoretic display stack 200. Sealant 234 may be used like the sealant 216 to support the integrated circuit 214, but a reduced amount may be used in the flexible electrophoretic display stack 230.

A hot melt protective sheet 236 may be disposed over the front plane laminate 204, the integrated circuit 214 and/or light blocking material 226, and a portion of the flexible printed circuit 218. The hot melt protective sheet 236 may conform to the components of the flexible electrophoretic display stack 230 and may be applied in a liquid or semi-liquid form in some embodiments. The hot melt protective sheet 236 may have a thickness of about 50 microns and may provide a moisture barrier, ultraviolet light blocking, and oxygen penetration prevention properties. The hot melt protective sheet may be laminated to an electrode layer and may conform to the integrated circuit 214. The flexible electrophoretic display stack 230 may have an overall thickness that is less than the flexible electrophoretic display stack 200. In some embodiments, the hot melt protective sheet 236 may be a composite hot melt protective sheet layer having a polymer substrate layer and an optically clear adhesive layer. An electrode layer (which may be part of a front plane laminate layer, in an example) may be coupled to the composite hot melt protective sheet layer. A microcapsule layer or e-ink material layer may be coupled to the electrode layer, and the electrode layer may be configured to apply a voltage to the microcapsule layer, so as to present content on the display.

In some embodiments, a flexible electrophoretic display may include a flexible plastic TFT backplane (e.g., polyimide backplane, etc.) having a first width. An electrophoretic layer may be coupled to the flexible TFT backplane, and an electrode layer may be coupled to the electrophoretic layer. The electrophoretic layer may be a microcapsule layer and may be part of a front plane laminate structure. An integrated circuit may be disposed on the flexible plastic TFT backplane, and a protective sheet having a second width that is greater than or equal to the first width. The protective sheet may be disposed about a side of the flexible electrophoretic display opposite the flexible TFT backplane. The flexible plastic TFT backplane may be formed of a polyimide material.

Figure 4:
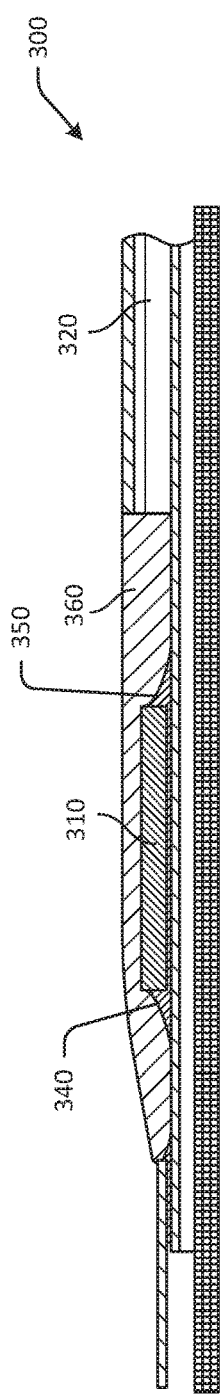
FIG. 4 is a schematic illustration of a cross-sectional view of a portion of a display stack with an integrated circuit in accordance with one or more embodiments of the disclosure.

FIG. 4 depicts a portion of a display stack 300 with an integrated circuit 310 in accordance with one or more embodiments of the disclosure. The integrated circuit 310 may be a driver integrated circuit and may drive one or more electrodes of a display stack. The display stack 300 may include a front plane laminate 320 and other components. The front plane laminate 320 may be coupled to a polyimide material layer. The integrated circuit 310 may be disposed on the polyimide material layer adjacent to, but separated from, the front plane laminate 320. The integrated circuit 320 may be bonded to the polyimide material layer or another component of the display stack 300 with anisotropic conductive film (ACF). ACF bonding may include creating electric conductive adhesive bonds between flexible and rigid components, and may have a thickness of about 30 microns or less. For example, a first ACF bond 340 may be formed on a first side of the integrated circuit 310, and a second ACF bond 350 may be formed on a second side of the integrated circuit 310. In some embodiments, the ACF bonds 340, 350 may bond the integrated circuit 310 to a flexible printed circuit. An epoxy layer 360 may be positioned about the integrated circuit 310 and may conform to the integrated circuit 310 and the ACF bonds 340, 350, and may be formed of an epoxy material. The epoxy layer 360 may be used to planarize or form a smooth surface over the integrated circuit 310.

Figure 5:
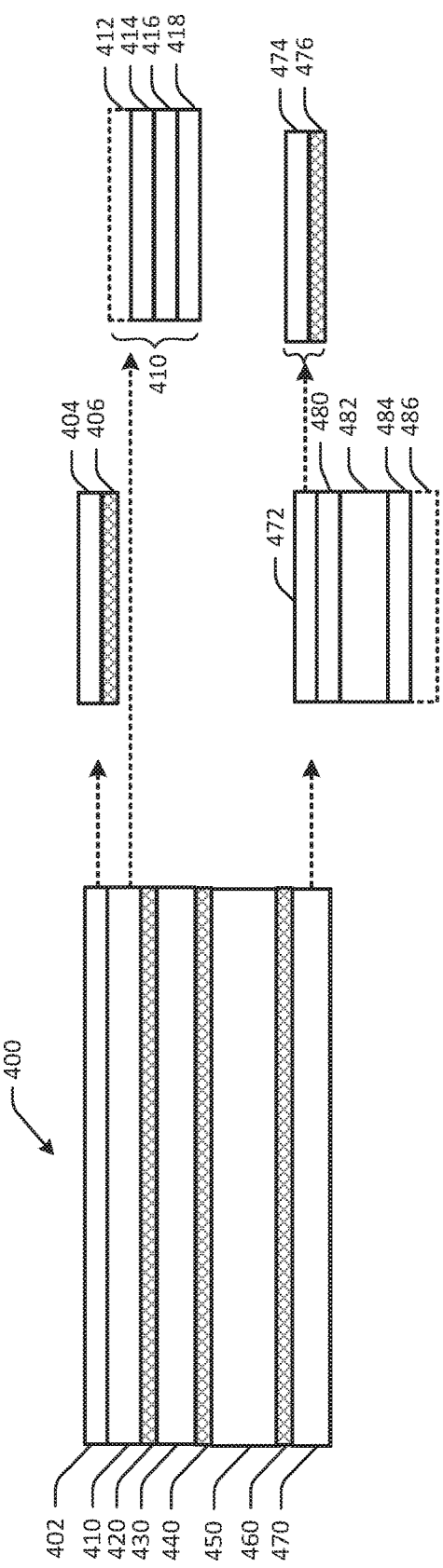
FIG. 5 is a schematic illustration of a self-healing flexible electrophoretic display stack in accordance with one or more embodiments of the disclosure.

FIG. 5 depicts a self-healing flexible electrophoretic display stack 400 in accordance with one or more embodiments of the disclosure. Some or all components or layers may not be included in other embodiments. Different embodiments may include additional or fewer, or different, materials, components, or layers. The display stack 400 may include an anti-glare and/or anti-reflective material layer 402. The anti-glare and/or anti-reflective material layer 402 may include one or more self-healing material layers. In some embodiments, the anti-glare and/or anti-reflective material layer 402 may be a composite layer. For example, as illustrated in FIG. 5, the anti-glare and/or anti-reflective material layer 402 may include a self-healing material layer 404 disposed on a rigid substrate layer 406. The self-healing material layer 404 may have one or more anti-glare or anti-reflective properties.

A plastic cover lens 410 may be coupled to the anti-glare and/or anti-reflective material layer 402. The plastic cover lens 410, in one embodiment, may be a composite layer. For example, the plastic cover lens 410 may include an optional self-healing material layer 412 (e.g., in some embodiments, there may not be a separate anti-glare and/or anti-reflective material layer 402, etc.) that is disposed on a tri-layered substrate. The tri-layered substrate may include a first polymethyl methacrylate (PMMA) layer 414, a second PMMA layer 418, and a polycarbonate layer 416 disposed between the first PMMA layer 414 and the second PMMA layer 418. The polycarbonate layer 416 may form a core of the tri-layered substrate.

A first optically clear adhesive layer 420 may be disposed between the plastic cover lens 410 and a touch layer 430. The first optically clear adhesive layer 420 may couple the plastic cover lens 410 to the touch layer 430. The touch layer 430 may be an olefin or other material layer and may be used to detect capacitive or resistive touches or contact with the display stack. In some embodiments, the plastic cover lens may be a composite self-healing plastic cover lens with a rigid plastic substrate layer, and a self-healing material layer disposed on the rigid plastic substrate layer. The self-healing material layer may be positioned between the rigid plastic substrate layer and the anti-glare material layer. In some embodiments, the self-healing plastic cover lens may be a composite self-healing plastic cover lens having a plastic substrate layer, an anti-glare material layer, and a self-healing material layer disposed on the plastic substrate layer. The self-healing material layer may be positioned between the plastic substrate layer and the anti-glare material layer, or may form an outer surface of the structure. The self-healing material layer may serve, in some embodiments, as an anti-glare material. For example, some self-healing materials can be hot-embossed to form surface structures or surface features that have anti-glare properties. Example surface features may include roughening features that scatter light and reduce glare without affecting transparency, such as teeth or other textured surfaces like lotus leafs and other patterns. The self-healing material may be the first layer on the cover lens that users can interact with. In some embodiments, the plastic cover lens may not include a self-healing material or have self-healing properties. In other embodiments, the plastic cover lens may include an ultraviolet light blocking material, such as an ultraviolet light blocking coating, a UV-cut material, or another UV-protective material. The UV protective material may be a layer of the plastic cover lens, or may be integrated into a layer of the plastic cover lens, and may protect the plastic components of the display stack from a yellowing effect as a result of exposure to ultraviolet light. The UV protective material may have various UV light blocking properties. For example, the UV protective material may allow 2.3% of ultraviolet light having a wavelength of about 360 nm to about 370 nm to penetrate the UV protective material. In other words, the UV protective material may have a transparency of about 2.3% for wavelengths 360 nm-370 nm, a transparency of about 10% for wavelengths 370 nm-380 nm, a transparency of about 30% for wavelengths 380 nm-390 nm, and/or a transparency of about 75% for wavelengths equal to or greater than about 440 nm. Other embodiments may have different UV related values.

A second optically clear adhesive layer 440 may be disposed between the touch layer 430 and a light guide 450. A third optically clear adhesive layer 460 may be disposed between the light guide 450 and a flexible electrophoretic display layer 470. In some embodiments, the touch sensor layer may be integrated into the light guide. For example, the touch sensor layer may be at least partially formed by optical patterning on a surface of the light guide 450. In other embodiments, the touch sensor layer may be integrated into a "bottom" or lower surface of the plastic cover lens 410.

The flexible electrophoretic display layer 470 may include a number of flexible electrophoretic display embodiments. For example, in FIG. 5, the flexible electrophoretic display layer 470 may include a hot melt protective sheet 472. In some embodiments, the hot melt protective sheet 472 may be a composite sheet and may include a composite polymer 474 (which may be formed of a self-healing material) disposed on an optically clear adhesive layer 476. Other embodiments may include different types of hot melt protective sheets with different properties.

The hot melt protective sheet 472 may be positioned adjacent to a PET indium tin oxide electrode layer 480, which may facilitate touch detection for the display stack 400. The PET indium tin oxide electrode layer 480 may be coupled to a microcapsule layer 482, which may be an e-ink layer with a number of polyurethane or other microcapsules configured to react to an electrode or electric charge. The microcapsule layer 482 may include a dielectric solvent (e.g., a high dielectric, low viscosity suspending medium) and charged particles dispersed throughout the dielectric solvent. The charged particles may be of different colors (e.g., a combination of white, black, and/or colored particles). White particles and color particles, or white particles and black particles, may move within the dielectric solvent in response to an electric field applied thereto. For a mono type display stack, which generates black and white images on the display, the microcapsule layer 482 may contain white and black particles. For a display stack configured to generate colored images, the microcapsule layer 482 may contain white and colored particles. In some embodiments, the microcapsule layer 482 may have a thickness that is no greater than about 400 microns, no greater than about 350 microns, no greater than about 300 microns, no greater than about 300 microns, no greater than about 250 microns, no greater than about 200 microns, no greater than about 150 microns, no greater than about 120 microns, no greater than about 100 microns, no greater than about 80 microns, or no greater than about 60 microns.

The PET indium tin oxide electrode layer 480 may be coupled to a polyimide TFT layer 484. The polyimide TFT layer 484 may define an active area with one or more transistors. The polyimide TFT layer 484 may be configured to provide an electric field to influence the movement of charged particles within the microcapsule layer 482, which, in turn, may cause an image to be formed on the display. That is, if an electrical signal is applied to an electrode on the surface of the polyimide TFT layer 484, an electric field may be generated between the polyimide TFT layer 484 and the microcapsule layer 482. The generated electric field may cause charged particles (e.g., white, black, grey, and/or colored particles) to move within the microcapsule layer 482 so that an image or other content can be generated on the display of the device.

In embodiments with a passive matrix display, the polyimide TFT layer 484 may be patterned with a row electrode and a transparent conductive layer or the microcapsule layer 482 may include a column electrode, or vice versa. In embodiments with an active matrix display, the polyimide TFT layer 484 may include one or more pixel electrode(s), and the microcapsule layer 482 may include a uniform transparent electrode, such as a uniform layer of indium tin oxide. In a segmented-electrode display embodiment, segmented electrodes may be provided on a substrate, such as the polyimide TFT layer 484, and may each be driven independently with the desired voltage to give the desired optical state in a so-called "direct drive" scheme). In such embodiments, the microcapsule layer 482 may include a uniform transparent electrode. The polyimide TFT layer 484 may be disposed on a substantially flat portion or platform of the housing 102. The polyimide TFT layer 484 may also include a set of patterned electrodes with each electrode connected to its own driver, such as a segmented display.

An optional back protective sheet 486 may be coupled to, or positioned adjacent, the polyimide TFT layer 484 or TFT backplane and may support the polyimide TFT layer 484 and/or the display stack 400. The self-healing flexible electrophoretic display stack 400 may be used, for example, in devices with dark colored housings or light colored housings. A rigid sealant material may be disposed on the back protective sheet adjacent to at least one edge of the flexible plastic TFT backplane in some embodiments.

Figure 6:
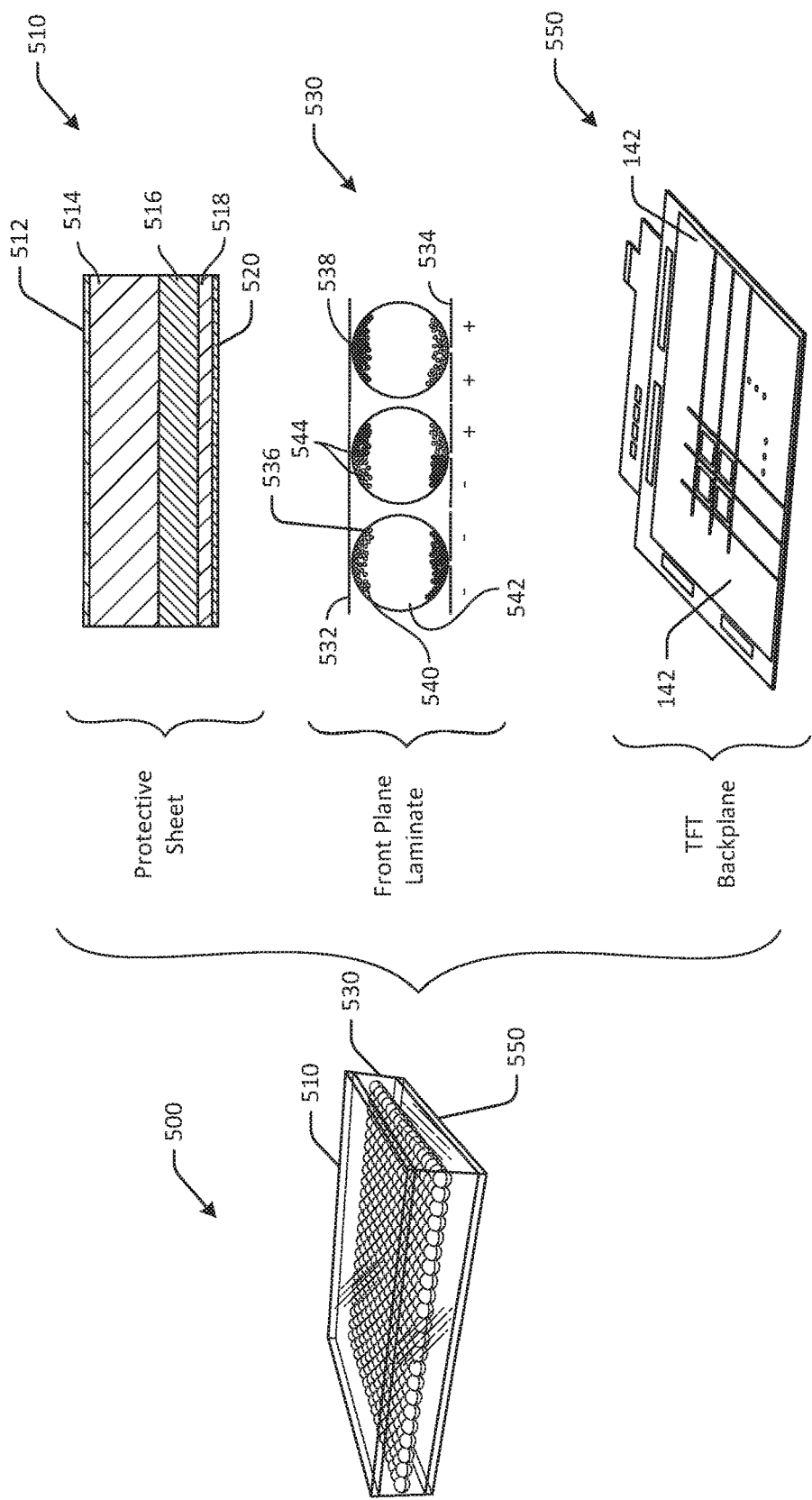
FIG. 6 is a schematic illustration of components of a self-healing flexible electrophoretic display stack in accordance with one or more embodiments of the disclosure.

FIG. 6 depicts a self-healing flexible electrophoretic display stack 500 in accordance with one or more embodiments of the disclosure. The self-healing flexible electrophoretic display stack 500 may include three components in the illustrated embodiment. In particular, a protective sheet 510 may be coupled to a front plane laminate 530. The front plane laminate 530 may be coupled to a TFT backplane and driver layer 550.

The protective sheet 510 may include an anti-reflective and/or anti-glare material layer 512 on an outer surface of the protective sheet 510. The anti-reflective and/or anti-glare material layer 512 may be disposed on a PET layer 514. A soft adhesive layer 516 may be positioned on a side of the PET layer 514 opposite the anti-reflective and/or anti-glare material layer 512. A barrier film layer 518 may be disposed on the soft adhesive layer 516 and coupled to the PET layer 514. An inorganic coating 520 may be disposed on the barrier film layer 518.

The front plane laminate 530 may be an e-ink layer and may include one or more microcapsules disposed between electrodes. For example, the front plane laminate 530 may include a top transparent electrode 532 and a bottom electrode 534. A number of microcapsules 536 may be disposed between the top transparent electrode 532 and the bottom electrode 534. One or more, or each, of the microcapsules 536 may include a positively charged black pigment 538 and/or a negatively charged white pigment 540. The black pigment 538 and the white pigment 540 may be disposed or submersed in a clear fluid 542 in the respective microcapsules 536. In some embodiments, the microcapsules 536 may be sub-capsule addressed to increase resolution and/or improve display capability. An example of a sub-capsule addressed microcapsule 544 is illustrated in FIG. 6.

The TFT backplane and driver layer 550 may include gate drivers and select/row lines 552, and may also include source drivers and data/column lines 554. The TFT backplane and driver layer 550 may drive one or more components of the front plane laminate 530 to present content on the display stack 500.

FIGS. 7-8 depict electronic devices with self-healing flexible electrophoretic displays in accordance with one or more embodiments of the disclosure. In FIG. 7, a device 600 may include a self-healing flexible electrophoretic display 610. The self-healing flexible electrophoretic display 610 may include a front protective sheet 612, a front plane laminate 614, a polyimide material layer 616, and a back protective sheet 618.

The device 600 may include a cover lens 620 coupled to the self-healing flexible electrophoretic display 610 with one or more optically clear adhesive layers 622. The device 600 may include a driver integrated circuit 624 and a flexible printed circuit 626. An epoxy seal 628 may be disposed about the driver integrated circuit 624.

To support the flexible printed circuit 626 during assembly, a portion of double sided tape 630 may be used to couple the flexible printed circuit 626 to the cover lens 620. The double sided tape 630 may secure the flexible printed circuit 626 and may provide stability during and after assembly.

In FIG. 8, another embodiment of a device 650 with a self-healing flexible electrophoretic display 660 is illustrated. In FIG. 8, the self-healing flexible electrophoretic display 660 may include a front protective sheet 662 coupled to a front plane laminate 664 with one or more optically clear adhesive layers 666. The front plane laminate 664 may be coupled to a polyimide layer 668. The polyimide layer 668 may be disposed on a back protective sheet 670. The back protective sheet 670 may be mounted on or secured to a mid-frame 672 of the device 650.

A driver integrated circuit 674 may be disposed on the polyimide layer 668 adjacent to the front plane laminate 664. One or more portions of rigid sealant 676 may be disposed along one or more sides or edges of the driver integrated circuit 674. Additional sealant and/or stiffener material may include a second sealant portion 678 positioned adjacent to the front plane laminate 664 and may be disposed on the polyimide layer 668. A third sealant portion 680 may be disposed adjacent to the front protective sheet 662 and disposed on a flexible printed circuit 682. A fourth sealant portion 684 or stiffener may be disposed on a side of the flexible printed circuit 682 opposite the third sealant portion 680. The fourth sealant portion 684 may overhang the back protective sheet 670 by a distance 686. A portion of double sided tape 688 may be used to couple the flexible printed circuit 682 to a cover lens 690 of the device 650. The double sided tape 688 may have a width 692 that is greater than the overhang distance 686.

Figure 9:
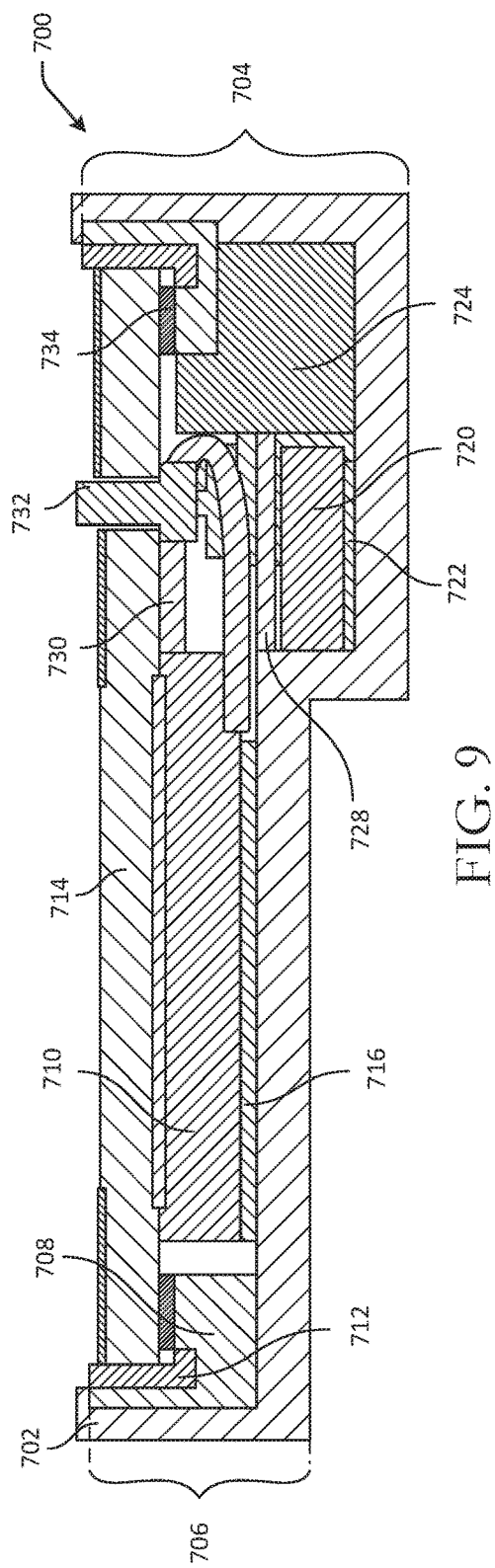
FIG. 9 is a schematic illustration of a self-healing flexible electrophoretic display stack positioned in an electronic device in accordance with one or more embodiments of the disclosure.

FIG. 9 depicts a self-healing flexible electrophoretic display assembly 710 positioned in an electronic device 700 in accordance with one or more embodiments of the disclosure. The device 700 may include a housing 702 with a grip portion 704 configured to be held by users during operation of the device 700, and a blade portion 706, which may be relatively thinner than the grip portion 704. The housing 702 may be formed of one or more materials. For example, the housing 702 may be formed of aluminum, while another portion 708 of the housing may be formed of plastic. A rubber ring 712 may be positioned in the portion 708 of the housing formed of plastic.

A plastic cover lens 714 may form an outer surface of the device 700. The plastic cover lens 714 may be coupled to the self-healing flexible electrophoretic display assembly 710, for example, with an optically clear adhesive. The self-healing flexible electrophoretic display assembly 710 may be adhered to the housing 702 of the device 700 with an adhesive 716. Because the self-healing flexible electrophoretic display assembly 710 does not include glass, and because of the flexible and shatter resistant characteristics of the self-healing flexible electrophoretic display assembly 710, the self-healing flexible electrophoretic display assembly 710 may be mounted to the housing 702 of the device 700 with the adhesive 716.

A battery 720 may be adhered to the housing 702 in the grip portion 704 with an adhesive 722. An antenna assembly 724 may be positioned in the grip portion 704 adjacent to the battery 720. An epoxy shield 728 may be disposed on the battery 720 and may be in contact with a flexible printed circuit 730. A page turn button assembly 732 may be disposed adjacent the cover lens 714. An adhesive 734 may secure the cover lens 714 to a portion of the housing 702 or another component of the device 700.

Figure 10:
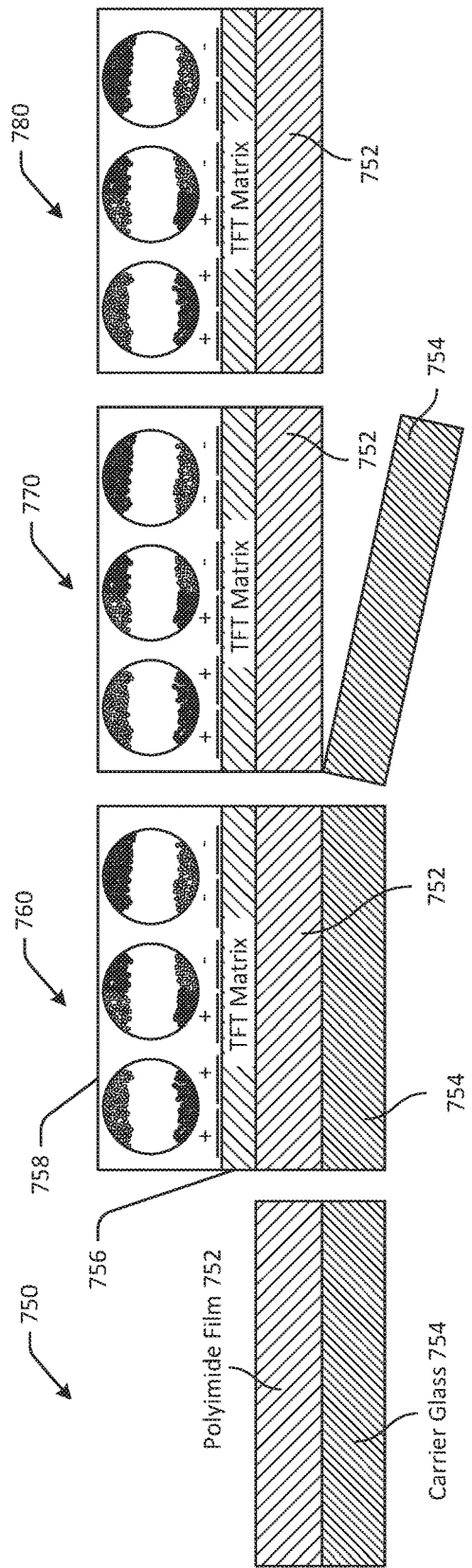
FIG. 10 is an example schematic process flow for manufacturing a protective sheet in accordance with one or more embodiments of the disclosure.

FIG. 10 is an example schematic process flow for manufacturing a protective sheet in accordance with one or more embodiments of the disclosure. At a first step 750, a polyimide film 752 is provided on a carrier glass 754. The carrier glass 754 may be coated with the polymer. At a second step 760 the display function layers are built on the polyimide film 752. For example, a TFT matrix layer 756 and an electrophoretic layer 758 are coupled to the polyimide film 752. At a third step 770, the display layers are de-bonded from the carrier glass 754. At a fourth step 780, the flexible display on a polymer film is formed without the carrier glass. As a result of removing glass from this structure, an assembled weight of the structure may be reduced, and flexibility of the structure may be increased. Devices incorporating the structure may therefore be thinner, lighter, and more reliable and durable.

Figure 11:
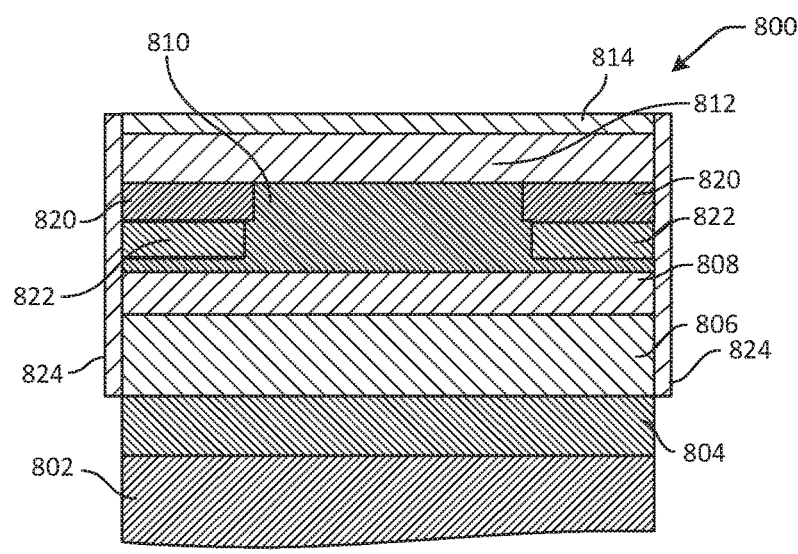
FIGS. 11-13 are schematic illustrations of cross-sectional views of white mask stacks in accordance with one or more embodiments of the disclosure.
Figure 12:
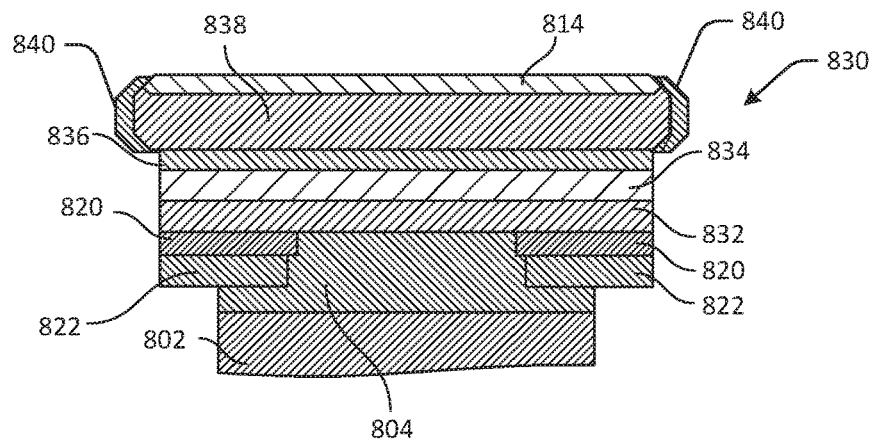
Figure 13:
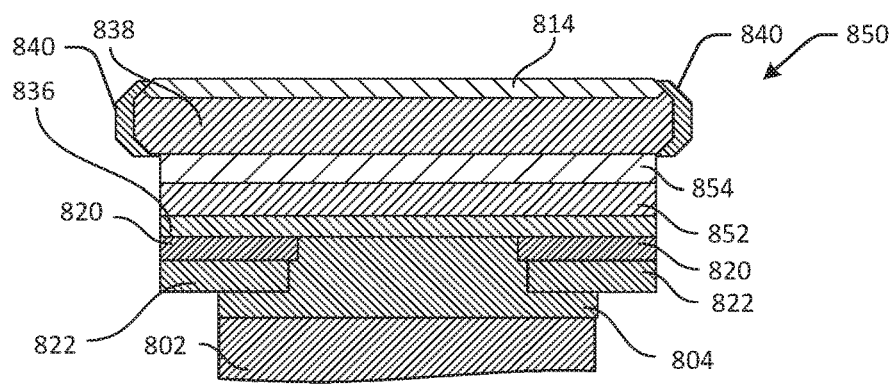

FIGS. 11-13 are schematic illustrations of cross-sectional views of white mask stacks in accordance with one or more embodiments of the disclosure. The white mask stacks may be used for devices that have lighter colored, such as white colored, housings, or devices where light leakage affects usage of the device.

A first embodiment 800 includes a display stack 802 where a first optically clear adhesive layer 804 couples the display stack 802 to a set of components, some of which may collectively form a cover lens for the device. In particular, the first optically clear adhesive layer 804 may couple the display stack 802 to a polycarbonate layer 806. A second optically clear adhesive layer 808 may couple the polycarbonate layer 806 to an optically clear planarization coating layer 810. The optically clear planarization coating layer 810 maybe coupled to a PET layer 812 with ultraviolet light blocking or filtering properties. An anti-glare coating 814 may include a self-healing material and may be coupled to the PET layer 812.

The optically clear planarization coating layer 810 may be used to planarize a layer of the white mask that includes one or more dried white ink layers and one or more dried black ink layers. For example, a set of dried white ink layers 820 may be coupled to a surface of the PET layer 812. The set of dried white ink layers 820 may be disposed about a perimeter of the PET layer 812. A set of dried black ink layers 822 may be coupled to the dried white ink layers 820. The white mask may include more dried white ink layers 820 than dried black ink layers 822. Other ink colors may be used, with relatively dark colored layers positioned "lower" in the stack than relatively lighter colored layers. Black ink layers 824 may be disposed about edges of the white mask, so as to prevent light leakage about edges of the device housing.

The PET layer 812 may have a thickness of about 75 microns, the optically clear planarization coating layer 810 may have a thickness of about 30-50 microns, the second optically clear adhesive layer 808 may have a thickness of about 100 microns, and the polycarbonate layer 806 may have a thickness of about 0.4 to about 0.5 millimeters. The white mask in the first embodiment 800 may therefore have an increased thickness of between about 100 to about 250 microns relative to other assemblies without white masks.

In a second embodiment 830, the display stack 802 and the first optically clear adhesive layer 804 may be included. However, the dried white ink layers 820 and the dried black ink layers 822 may be positioned at the first optically clear adhesive layer 804, and a planarization layer may not be included. The first optically clear adhesive layer 804 may have a thickness of about 175 microns in the second embodiment. The dried white ink layers 820 may be coupled to a PET layer 832 having a thickness of about 50 microns. An adhesive layer 834 may be disposed on the PET layer 832 opposite the dried white ink layers 820. A low index coating layer 836 may be disposed on the adhesive layer 834 and may have a thickness of about 2 microns. The low index coating layer 836 may be a low refraction index material having, in an example, a refractive index value of equal to or greater than about 1.0 and less than or equal to about 1.28, such as about 1.000293 nm. The low index coating layer 836 may be a low refraction index material with hollow spheres of glass filled with air, where the hollow spheres have a thickness of about 60 nm. In another example, the hollow spheres may be silica hollow spheres in a silicone or acrylic resin layer.

The adhesive layer 834 may support the low index coating layer 836. A co-extruded tri-layer plastic cover lens 838 may be positioned adjacent the low index coating layer 836. The co-extruded tri-layer plastic cover lens 838 may include a first PMMA layer, a polycarbonate layer, and a second PMMA layer, where the polycarbonate layer is disposed between the first PMMA layer and the second PMMA layer. The anti-glare coating 814 may be disposed on the co-extruded tri-layer plastic cover lens 838. The second embodiment 830 may include edge ink layers 840 along edges of the co-extruded tri-layer plastic cover lens 838, and the edge ink layers 840 may not extend vertically down the assembly, unlike in the first embodiment 800. The second embodiment 830 may be slightly wider than the first embodiment 800, and the co-extruded tri-layer plastic cover lens 838 may have a greater width than the display stack 802. The second embodiment 830 may have an overall thickness that is about 70 microns to about 120 microns thicker than other devices without white masks.

A third embodiment 850 may be similar to the second embodiment 830, but may have a different arrangement and structure. For example, in the third embodiment 850, the display stack 802 may be coupled to the first optically clear adhesive layer 804, and the dried white ink layers 820 and the dried black ink layers 822 may be disposed adjacent the first optically clear adhesive layer 804.

The low index coating layer 836 may be positioned adjacent to the first optically clear adhesive layer 804 instead of adjacent to the co-extruded tri-layer plastic cover lens 838. An acrylic layer 852 having a thickness of about 7 to 10 microns may be positioned adjacent the low index coating layer 836. An adhesive layer 854 having a thickness of about 10 microns (as opposed to the 20 micron thickness of the adhesive layer 834 in the second embodiment 830) may be positioned adjacent the acrylic layer 852. The co-extruded tri-layer plastic cover lens 838 may be positioned adjacent to the adhesive layer 854. The anti-glare layer 814 may be disposed on the co-extruded tri-layer plastic cover lens 838, and the edge ink layers 840 may be disposed along the edge surfaces of the co-extruded tri-layer plastic cover lens 838.

One or more operations of the methods, process flows, or use cases of FIGS. 1-13 may have been described above as being performed by a user device, or more specifically, by one or more program module(s), applications, or the like executing on a device. It should be appreciated, however, that any of the operations of the methods, process flows, or use cases of FIGS. 1-13 may be performed, at least in part, in a distributed manner by one or more other devices, or more specifically, by one or more program module(s), applications, or the like executing on such devices. In addition, it should be appreciated that processing performed in response to the execution of computer-executable instructions provided as part of an application, program module, or the like may be interchangeably described herein as being performed by the application or the program module itself or by a device on which the application, program module, or the like is executing. While the operations of the methods, process flows, or use cases of FIGS. 1-13 may be described in the context of the illustrative devices, it should be appreciated that such operations may be implemented in connection with numerous other device configurations.

The operations described and depicted in the illustrative methods, process flows, and use cases of FIGS. 1-13 may be carried out or performed in any suitable order, such as the depicted orders, as desired in various example embodiments of the disclosure. Additionally, in certain example embodiments, at least a portion of the operations may be carried out in parallel. Furthermore, in certain example embodiments, less, more, or different operations than those depicted in FIGS. 1-13 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by the execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Illustrative Computer Architecture

Figure 14:
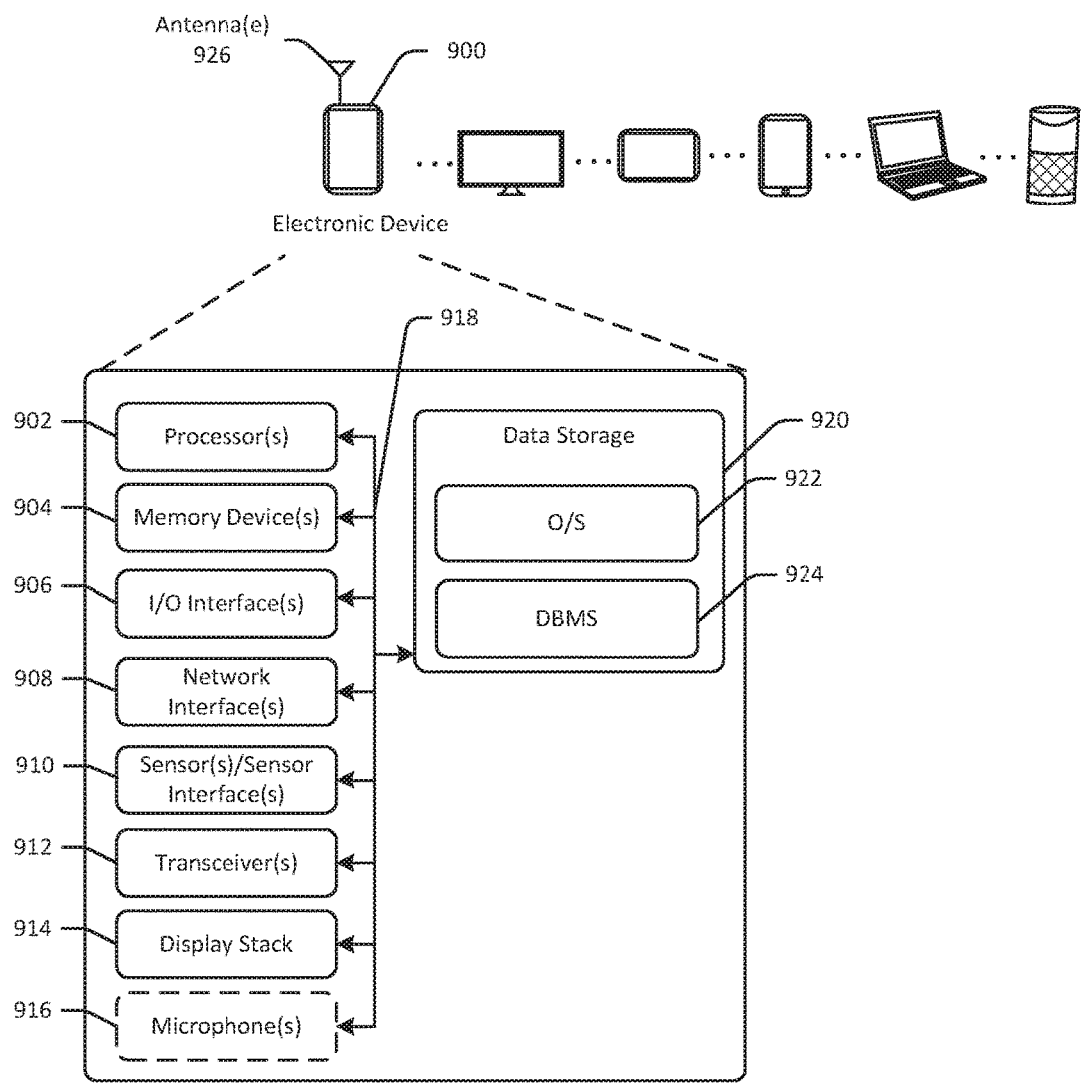
FIG. 14 schematically illustrates an example architecture of an electronic device in accordance with one or more embodiments of the disclosure.

FIG. 14 is a schematic block diagram of one or more illustrative electronic device(s) 900 in accordance with one or more example embodiments of the disclosure. The electronic device(s) 900 may include any suitable computing device including, but not limited to, a server system, a mobile device such as a smartphone, a tablet, an e-reader, a wearable device, or the like; a desktop computer; a laptop computer; a content streaming device; a set-top box; a scanning device; a barcode scanning wand; or the like. The electronic device(s) 900 may correspond to an illustrative device configuration for the device(s) of FIGS. 1-13.

The electronic device(s) 900 may be configured to communicate with one or more servers, user devices, or the like. The electronic device(s) 900 may be configured to determine voice commands, determine wakeword utterances, present digital content, determine and/or control other devices, and other operations.

The electronic device(s) 900 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the electronic device(s) 900 may include one or more processors (processor(s)) 902, one or more memory devices 904 (also referred to herein as memory 904), one or more input/output (I/O) interface(s) 906, one or more network interface(s) 908, one or more sensor(s) or sensor interface(s) 910, one or more transceiver(s) 912, one or more display stack(s) 914, one or more optional microphone(s) 916, and data storage 920. The electronic device(s) 900 may further include one or more bus(es) 918 that functionally couple various components of the electronic device(s) 900. The electronic device(s) 900 may further include one or more antenna(e) 926 that may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 918 may include at least one of a system bus, a memory bus, an address bus, or a message bus, and may permit the exchange of information (e.g., data (including computer-executable code), signaling, etc.) between various components of the electronic device(s) 900. The bus(es) 918 may include, without limitation, a memory bus or a memory controller, a peripheral bus, an accelerated graphics port, and so forth. The bus(es) 918 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 904 of the electronic device(s) 900 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 904 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 904 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 920 may include removable storage and/or non-removable storage including, but not limited to, magnetic storage, optical disk storage, and/or tape storage. The data storage 920 may provide non-volatile storage of computer-executable instructions and other data. The memory 904 and the data storage 920, removable and/or non-removable, are examples of computer-readable storage media (CRSM) as that term is used herein.

The data storage 920 may store computer-executable code, instructions, or the like that may be loadable into the memory 904 and executable by the processor(s) 902 to cause the processor(s) 902 to perform or initiate various operations. The data storage 920 may additionally store data that may be copied to the memory 904 for use by the processor(s) 902 during the execution of the computer-executable instructions. Moreover, output data generated as a result of execution of the computer-executable instructions by the processor(s) 902 may be stored initially in the memory 904, and may ultimately be copied to the data storage 920 for non-volatile storage.

More specifically, the data storage 920 may store one or more operating systems (O/S) 922; one or more database management systems (DBMS) 924; and one or more program module(s), applications, engines, computer-executable code, scripts, or the like. Some or all of these module(s) may be sub-module(s). Any of the components depicted as being stored in the data storage 920 may include any combination of software, firmware, and/or hardware. The software and/or firmware may include computer-executable code, instructions, or the like that may be loaded into the memory 904 for execution by one or more of the processor(s) 902. Any of the components depicted as being stored in the data storage 920 may support functionality described in reference to corresponding components named earlier in this disclosure.

The data storage 920 may further store various types of data utilized by the components of the electronic device(s) 900. Any data stored in the data storage 920 may be loaded into the memory 904 for use by the processor(s) 902 in executing computer-executable code. In addition, any data depicted as being stored in the data storage 920 may potentially be stored in one or more datastore(s) and may be accessed via the DBMS 924 and loaded in the memory 904 for use by the processor(s) 902 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like.

The processor(s) 902 may be configured to access the memory 904 and execute the computer-executable instructions loaded therein. For example, the processor(s) 902 may be configured to execute the computer-executable instructions of the various program module(s), applications, engines, or the like of the electronic device(s) 900 to cause or facilitate various operations to be performed in accordance with one or more embodiments of the disclosure. The processor(s) 902 may include any suitable processing unit capable of accepting data as input, processing the input data in accordance with stored computer-executable instructions, and generating output data. The processor(s) 902 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 902 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 902 may be capable of supporting any of a variety of instruction sets.

Referring now to other illustrative components depicted as being stored in the data storage 920, the O/S 922 may be loaded from the data storage 920 into the memory 904 and may provide an interface between other application software executing on the electronic device(s) 900 and the hardware resources of the electronic device(s) 900. More specifically, the O/S 922 may include a set of computer-executable instructions for managing the hardware resources of the electronic device(s) 900 and for providing common services to other application programs (e.g., managing memory allocation among various application programs). In certain example embodiments, the O/S 922 may control execution of the other program module(s). The O/S 922 may include any operating system now known or which may be developed in the future including, but not limited to, any server operating system, any mainframe operating system, or any other proprietary or non-proprietary operating system.

The DBMS 924 may be loaded into the memory 904 and may support functionality for accessing, retrieving, storing, and/or manipulating data stored in the memory 904 and/or data stored in the data storage 920. The DBMS 924 may use any of a variety of database models (e.g., relational model, object model, etc.) and may support any of a variety of query languages. The DBMS 924 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the electronic device(s) 900 is a mobile device, the DBMS 924 may be any suitable lightweight DBMS optimized for performance on a mobile device.

Referring now to other illustrative components of the electronic device(s) 900, the input/output (I/O) interface(s) 906 may facilitate the receipt of input information by the electronic device(s) 900 from one or more I/O devices as well as the output of information from the electronic device(s) 900 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the electronic device(s) 900 or may be separate. The I/O devices may further include, for example, any number of peripheral devices such as data storage devices, printing devices, and so forth.

The I/O interface(s) 906 may also include an interface for an external peripheral device connection such as universal serial bus (USB), FireWire, Thunderbolt, Ethernet port or other connection protocol that may connect to one or more networks. The I/O interface(s) 906 may also include a connection to one or more of the antenna(e) 926 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, etc.

The electronic device(s) 900 may further include one or more network interface(s) 908 via which the electronic device(s) 900 may communicate with any of a variety of other systems, platforms, networks, devices, and so forth. The network interface(s) 908 may enable communication, for example, with one or more wireless routers, one or more host servers, one or more web servers, and the like via one or more networks.

The antenna(e) 926 may include any suitable type of antenna depending, for example, on the communications protocols used to transmit or receive signals via the antenna(e) 926. Non-limiting examples of suitable antennae may include directional antennae, non-directional antennae, dipole antennae, folded dipole antennae, patch antennae, multiple-input multiple-output (MIMO) antennae, or the like. The antenna(e) 926 may be communicatively coupled to one or more transceivers 912 or radio components to which or from which signals may be transmitted or received.

As previously described, the antenna(e) 926 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(e) 926 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(e) 926 may be configured to transmit or receive radio frequency signals within any suitable frequency range forming part of the unlicensed portion of the radio spectrum.

The antenna(e) 926 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 912 may include any suitable radio component(s) for—in cooperation with the antenna(e) 926—transmitting or receiving radio frequency (RF) signals in the bandwidth and/or channels corresponding to the communications protocols utilized by the electronic device(s) 900 to communicate with other devices. The transceiver(s) 912 may include hardware, software, and/or firmware for modulating, transmitting, or receiving—potentially in cooperation with any of antenna(e) 926—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 912 may further include hardware, firmware, or software for receiving GNSS signals. The transceiver(s) 912 may include any known receiver and baseband suitable for communicating via the communications protocols utilized by the electronic device(s) 900. The transceiver(s) 912 may further include a low noise amplifier (LNA), additional signal amplifiers, an analog-to-digital (A/D) converter, one or more buffers, a digital baseband, or the like.

The sensor(s)/sensor interface(s) 910 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The display stack(s) 914 may be an electrophoretic display stack, such as those described in conjunction with FIGS. 1-13. The microphone(s) 916 may be any device configured to receive analog sound input or voice data.

It should be appreciated that the program module(s), applications, computer-executable instructions, code, or the like depicted in FIG. 14 as being stored in the data storage 920 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the electronic device(s) 900, and/or hosted on other computing device(s) accessible via one or more networks, may be provided to support functionality provided by the program module(s), applications, or computer-executable code depicted in FIG. 14 and/or additional or alternate functionality. Further, functionality may be modularized differently such that processing described as being supported collectively by the collection of program module(s) depicted in FIG. 14 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 14 may be implemented, at least partially, in hardware and/or firmware across any number of devices.

It should further be appreciated that the electronic device(s) 900 may include alternate and/or additional hardware, software, or firmware components beyond those described or depicted without departing from the scope of the disclosure. More particularly, it should be appreciated that software, firmware, or hardware components depicted as forming part of the electronic device(s) 900 are merely illustrative and that some components may not be present or additional components may be provided in various embodiments. While various illustrative program module(s) have been depicted and described as software module(s) stored in the data storage 920, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

One or more operations of the methods, process flows, and use cases of FIGS. 1-13 may be performed by a device having the illustrative configuration depicted in FIG. 14, or more specifically, by one or more engines, program module(s), applications, or the like executable on such a device. It should be appreciated, however, that such operations may be implemented in connection with numerous other device configurations.

The operations described and depicted in the illustrative methods and process flows of FIGS. 1-13 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIGS. 1-13 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may,"

unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:

1. A self-healing display stack for use with an electronic reader device, the self-healing display stack comprising:
    a flexible electrophoretic display (EPD) layer comprising:
        a hot melt protective sheet layer comprising a polymer substrate layer and an optically clear adhesive layer;
        an electrode layer coupled to the hot melt protective sheet layer;
        a microcapsule layer coupled to the electrode layer, wherein the electrode layer is configured to apply a voltage to the microcapsule layer;
        a flexible polyimide thin film transistor (TFT) layer coupled to the microcapsule layer; and
        a back protective sheet coupled to the polyimide TFT layer, the back protective sheet configured to support the EPD layer;
    a first acrylic adhesive layer coupled to the EPD layer;
    a light guide coupled to the first acrylic adhesive layer;
    a second acrylic adhesive layer disposed on the light guide;
    a touch sensor layer coupled to the second acrylic adhesive layer;
    a third acrylic adhesive layer disposed on the touch sensor layer; and
    a self-healing plastic cover lens having a first surface and a second surface, the first surface comprising anti-glare surface features, wherein the self-healing plastic cover lens comprises a synthetic polyurethane polymer, and wherein the third acrylic adhesive layer is in contact with the second surface.

2. The self-healing display stack of claim 1, wherein the self-healing plastic cover lens comprises a plastic layer and a first material layer having an index of refraction between about 1 and about 1.28, and wherein the second surface is formed by the first material layer, the self-healing display stack further comprising:
    a first number of white ink layers in a stacked configuration disposed about a perimeter of the second surface, each layer of the first number of white ink layers having a first width; and
    a second number of black ink layers in a stacked configuration disposed vertically adjacent to the first number of white ink layers, each layer of the first number of black ink layers having a second width that is less than the first width, wherein the second number is less than the first number.

3. The self-healing display stack of claim 1, further comprising:
    an integrated circuit disposed on the flexible polyimide TFT layer laterally adjacent to the EPD layer;
    a first rigid sealant material disposed on a first portion of the flexible polyimide TFT layer along a first side of the integrated circuit, the first rigid sealant material configured to support the integrated circuit;
    a second rigid sealant material disposed on a second portion of the flexible polyimide TFT layer along a second side of the integrated circuit opposite the first side; and
    a black tape layer disposed between the integrated circuit and the hot melt protective sheet layer.

4. The self-healing display stack of claim 1, wherein the self-healing plastic cover lens comprises:
    a rigid plastic substrate; and
    a synthetic polyurethane polymer layer disposed on the rigid plastic substrate.

5. A self-healing display stack comprising:
    a light guide configured to direct light from one or more light emitting diodes (LEDs);
    a self-healing plastic cover lens comprising a synthetic polymer and having a first surface comprising anti-glare features; and
    a flexible electrophoretic display (EPD) comprising:
        a flexible plastic thin film transistor (TFT) backplane having a first width;
        an electrophoretic layer coupled to the flexible plastic TFT backplane;
        an electrode layer coupled to the electrophoretic layer;
        an integrated circuit disposed on the flexible plastic TFT backplane; and
        a first protective sheet having a second width that is greater than or equal to the first width.

6. The display stack of claim 5, wherein the first protective sheet is a hot melt protective sheet having a thickness of equal to or less than 50 microns, wherein the hot melt protective sheet and the electrode layer together conform to the integrated circuit.

7. The display stack of claim 5, wherein the integrated circuit is disposed adjacent to the electrophoretic layer, the display stack further comprising:
    a light blocking material layer positioned between the integrated circuit and the first protective sheet.

8. The display stack of claim 5, wherein the integrated circuit is disposed adjacent to the electrophoretic layer, the display stack further comprising:
    a light blocking material layer disposed on the first protective sheet and aligned with the integrated circuit.

9. The display stack of claim 5, further comprising:
    a touch sensor flexible printed circuit (FPC) at least partially disposed between the plastic cover lens and the light guide;
    an LED FPC disposed at least partially between the light guide and the flexible EPD; and
    an EPD FPC disposed vertically adjacent to the LED FPC.

10. The display stack of claim 5, further comprising:
    a rigid sealant material disposed on a portion of the flexible plastic TFT backplane along at least one edge surface of the integrated circuit;
    wherein the flexible plastic TFT backplane comprises a polyimide material.

11. The display stack of claim 5, wherein the plastic cover lens extends over the integrated circuit and the flexible plastic TFT backplane.

12. The display stack of claim 5, further comprising:
    a second protective sheet coupled to the flexible plastic TFT backplane; and
    a rigid sealant material disposed on a portion of the second protective sheet adjacent to at least one edge of the flexible plastic TFT backplane.

13. A device comprising:
a housing; and
a self-healing display stack adhered to the housing, the self-healing display stack comprising:
- a flexible plastic thin film transistor (TFT) backplane having a first width;
- an integrated circuit disposed on the flexible plastic TFT backplane;
- an electrophoretic layer coupled to the flexible TFT backplane;
- an electrode layer coupled to the electrophoretic layer;
- a light guide;
- a self-healing plastic cover lens comprising an ultraviolet light blocking material and a synthetic polymer, the self-healing plastic cover lens having a first surface comprising anti-glare features; and
- a first protective sheet having a second width that is greater than or equal to the first width.

14. The device of claim 13, wherein the first protective sheet is a hot melt protective sheet having a thickness of equal to or less than 50 microns, wherein the hot melt protective sheet and the electrode layer together conform to the integrated circuit.

15. The device of claim 13, wherein the plastic cover lens comprises:
a plastic substrate.

16. The device of claim 13, further comprising:
a second protective sheet coupled to the flexible plastic TFT backplane; and
a rigid sealant material disposed on a portion of the second protective sheet adjacent to at least one edge of the flexible plastic TFT backplane.

17. The device of claim 13, further comprising:
a rigid sealant material disposed on a portion of the flexible plastic TFT backplane along at least one edge surface of the integrated circuit.

18. The device of claim 13, further comprising:
a touch sensor layer integrated into the light guide.

19. The device of claim 13, wherein the plastic cover lens comprises a first coating layer having an index of refraction between about 1.0 and about 1.28, an adhesive layer, and a plastic layer, the device further comprising:
- a first number of white material layers in a stacked configuration disposed about a perimeter of the plastic layer or the first coating layer, the respective white material layers having a first width; and
- a second number of black material layers in a stacked configuration disposed adjacent to the white material layers, the respective black material layers having a second width.

20. The device of claim 13, wherein the plastic cover lens comprises:
- an anti-glare coating disposed on a first plastic layer;
- a first number of white material layers in a stacked configuration disposed about a perimeter of the first plastic layer, the respective white material layers having a first width;
- a second number of black material layers in a stacked configuration disposed adjacent to the white material layers, the respective black material layers having a second width;
- a planarization coating disposed on the plastic layer between the white material layers and the black material layers;
- an optically clear adhesive layer adjacent to the planarization coating; and
- a second plastic layer coupled to the optically clear adhesive layer.

* * * * *